(12) United States Patent
Goel

(10) Patent No.: US 9,021,335 B2
(45) Date of Patent: Apr. 28, 2015

(54) DATA RECOVERY FOR FAILED MEMORY DEVICE OF MEMORY DEVICE ARRAY

(71) Applicant: NetApp Inc., Sunnyvale, CA (US)

(72) Inventor: Atul Goel, Sunnyvale, CA (US)

(73) Assignee: NetApp, Inc., Sunnyvale, CA (US)

( * ) Notice: Subject to any disclaimer, the term of this patent is extended or adjusted under 35 U.S.C. 154(b) by 5 days.

(21) Appl. No.: 14/053,060

(22) Filed: Oct. 14, 2013

(65) Prior Publication Data

US 2014/0040661 A1    Feb. 6, 2014

Related U.S. Application Data

(63) Continuation of application No. 12/428,061, filed on Apr. 22, 2009, now Pat. No. 8,560,879.

(51) Int. Cl.
| | |
|---|---|
| *G06F 11/00* | (2006.01) |
| *G06F 11/07* | (2006.01) |
| *G06F 11/10* | (2006.01) |
| *G06F 11/16* | (2006.01) |
| *G06F 11/20* | (2006.01) |

(52) U.S. Cl.
CPC ........ *G06F 11/0709* (2013.01); *G06F 11/1088* (2013.01); *G06F 11/1662* (2013.01); *G06F 11/2094* (2013.01)

(58) Field of Classification Search
USPC ........................... 714/770, 6.1, 800; 711/162
See application file for complete search history.

(56) References Cited

U.S. PATENT DOCUMENTS

| | | | | |
|---|---|---|---|---|
| 5,596,709 | A * | 1/1997 | Bond et al. | 714/6.32 |
| 8,560,879 | B1 * | 10/2013 | Goel | 714/6.1 |
| 2002/0035667 | A1 * | 3/2002 | Bruning et al. | 711/114 |
| 2004/0260967 | A1 * | 12/2004 | Guha et al. | 714/3 |
| 2008/0168304 | A1 * | 7/2008 | Flynn et al. | 714/7 |

OTHER PUBLICATIONS

David A Patterson et al. A Case for Redundant Arrays of Inexpensive Disks (RAID), Univeristy of California, 1988.*

* cited by examiner

*Primary Examiner* — Yair Leibovich
(74) *Attorney, Agent, or Firm* — Cooper Legal Group, LLC

(57) ABSTRACT

Some aspects of the disclosure relate to a data storage system that includes multiple memory device storage devices. If a memory device of a memory device array fails within a first data storage device, some portions of the lost or corrupted data from the failed memory device are recovered by reading them from a second data storage device. Other portions of the lost or corrupted data from the failed memory device are recovered from parity information in the first data storage device.

20 Claims, 14 Drawing Sheets

DATA RECOVERY FOR FAILED MEMORY DEVICE OF MEMORY DEVICE ARRAY

RELATED APPLICATIONS

This application is a continuation of U.S. application Ser. No. 12/428,061, filed on Apr. 22, 2009, entitled "DATA RECOVERY FOR FAILED MEMORY DEVICE OF MEMORY DEVICE ARRAY", at least some of which may be incorporated herein.

BACKGROUND

In our modern communication age, business entities and consumers are storing an ever increasing amount of digitized data. For example, many entities are in the process of digitizing their business records and/or other business or non-business related data. Similarly, web based service providers generally engage in transactions that are primarily digital in nature. Thus, techniques and mechanisms that facilitate efficient and cost effective storage of vast amounts of digital data are being implemented.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

If a memory device fails in a large array of memory devices, parity-based recovery (e.g., where a missing or corrupted data block within a data "stripe" is recovered by reading the remaining data blocks in that stripe, including the parity block of the stripe) alone is impracticable for reconstructing lost data for several reasons, such as system performance and lengthy reconstruction times. In view of this and other shortcomings, the inventor(s) has/have devised data storage and recovery techniques that are more efficient than previous implementations, particularly by selectively recovering some of the lost data by reading copied data from a second data storage device and selectively recovering other of the lost data from parity information in the first or original data storage device.

One embodiment relates to a data storage system configured to efficiently recover lost original data from a failed memory device. The data storage system can be segmented into different data storage systems, where two of these different data storage systems may be referred to as first and second data storage devices, for example. Each of the first and second data storage systems can, in and of themselves, be distributed over a network. The first data storage device includes a first copy manager, a memory device array controller, and a memory device array that includes the failed memory device. The second data storage device includes a second copy manager, a memory device controller, and a data storage element. The first and second copy managers are configured to cooperatively manage an original data set and a full or partial copy of the original data set via a network link. In addition, the first and second data storage devices are configured to cooperatively recover a first portion of the lost original data by reading from the full or partial copy of the original data set and recover a second portion of the lost original data from parity information from the memory device array.

Other aspects of the disclosure relate to a method for reconstructing the contents of a failed memory device. In particular, a logical address of a data block is detected within a memory device array, where the memory device array includes the failed memory device. After the logical address is detected, the method checks if a copy of the data block exists on a second data storage device, which may in some instances be referred to as a system as it may be spread over a network. If so, the data block is retrieved from the second data storage device. Otherwise, the data block is recovered by using one or more parity blocks in the memory device array.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
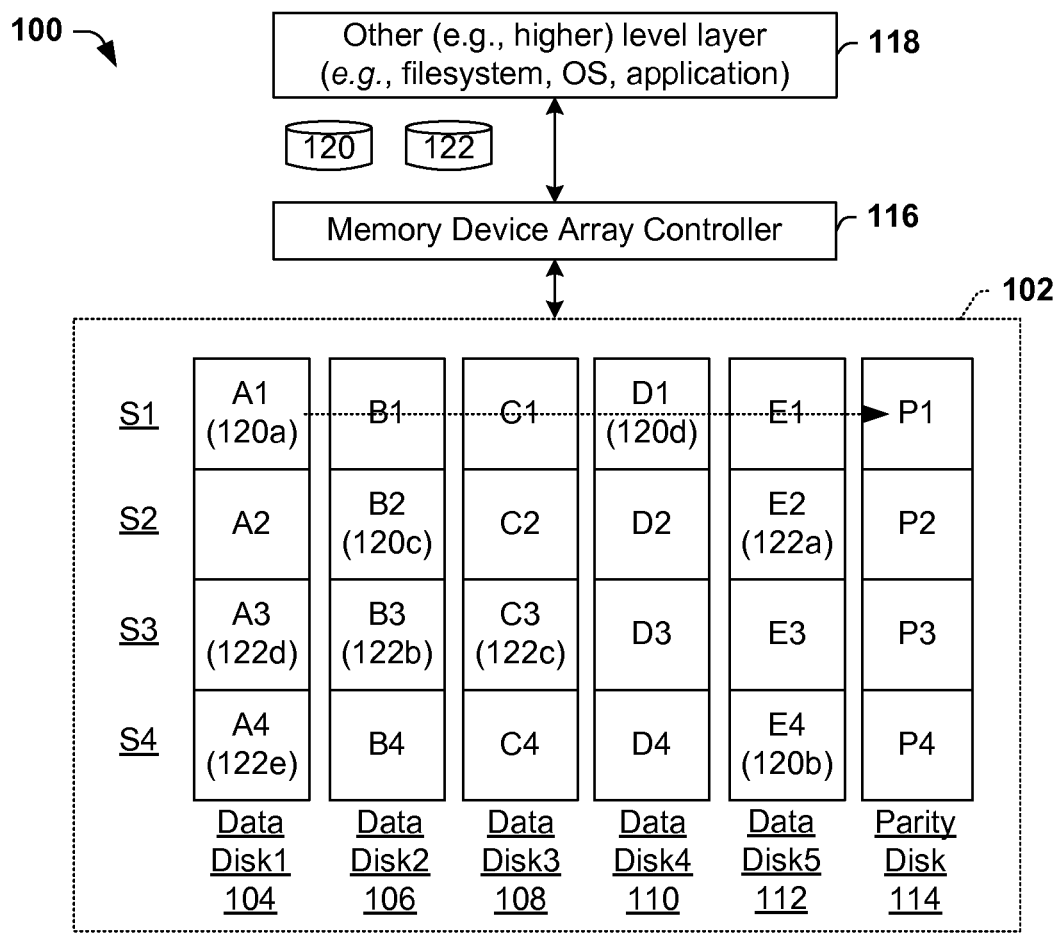
FIG. 1 is a block diagram illustrating a data storage system having a single disk array.

Some examples of the claimed subject matter are now described with reference to the drawings, where like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. Nothing in this detailed description is admitted as prior art.

Although several examples are described herein with reference to memory device arrays having a fixed number of memory devices (e.g., six disks); it will be appreciated that these examples are shown for purposes of simplicity and clarity and that concepts herein are applicable to other memory device arrays having any number of memory devices. Often, the number of memory devices in each memory device array is much larger than these illustrated examples. In addition, although data blocks, parity blocks, and metadata units stored on a given memory device are illustrated and described with reference to sample data sizes, concepts herein are applicable to virtually any size for these elements and should not be limited to those illustrated and described hereafter. Thus, all numbers are merely for purposes of illustration and ease of understanding and are not meant to limit the scope of the disclosure provided herein.

FIG. 1 illustrates an example of a data storage system 100 that includes a memory device array 102, such as a Redundant Array of independent memory devices (RAID array), which is made up of six separate memory devices (104-114, respectively). A memory device array controller 116—which may be implemented in dedicated hardware and/or in software—makes it appear to another layer 118 that the separate memory devices in the memory device array 102 are a single memory device. Although the other layer 118 is illustrated as possibly comprising as a higher level layer in the figures (e.g., an application layer), it is to be appreciated that this layer could also have other juxtapositions with respect to the memory device array controller 116 and its functions may be carried out before, after or simultaneously with the memory device controller functions described herein. In this manner, the memory device array controller 116 simplifies software design at the other layer 118 by allowing the other layer 118 to ignore the technical details involved with managing multiple memory devices.

To illustrate one manner in which this can be achieved, FIG. 1 illustrates an example where the other layer 118 accesses two data sets having different data (i.e., a first data set 120, and a second data set 122). These data sets, although actually scattered over the memory devices of the memory device array 102, are seen by the other layer 118 as contiguous blocks of logical addresses. Unbeknownst to this other layer 118, however, the memory device array controller 116 has actually remapped the other layer's contiguous blocks of logical addresses for the data sets into data blocks that are based on physical addresses. The physical addresses of these data blocks may be contiguous or non-contiguous.

For purposes of clarity, consider a scenario in which the first data set 120 contains a total of sixteen kilobytes (16 KB) of data and the second data set 122 contains a total of 20 KB of data. Thus, the other layer 118 sees first and second data sets 120, 122 having contiguous logical address spaces of 16 KB and 20 KB, respectively. However, in writing the first data set 120 to the memory device array 102, the memory device array controller 116 has fragmented the first data set 120 into four 4 KB data blocks (120a, 120b, 120c, and 120d), which are stored in physical address ranges (A1, E4, B2, and D1, respectively). Similarly, the memory device array controller 116 has fragmented the second data set 122 into five 4 KB data blocks (122a, 122b, 122c, 122d, and 122e), which are stored in physical address ranges (E2, B3, C3, A3, and A4, respectively). The data blocks, although described here as having equal data sizes, can also have different data sizes from one another.

To promote accurate data retention after data has been written to the memory device array 102, the memory device array controller 116 calculates parity blocks and stores them on a dedicated parity memory device 114. Parity-based recovery works on the principle that a missing or corrupted data block within a data "stripe" can be recovered by reading the remaining data blocks in that stripe, including the parity block of the stripe. For example, for horizontal stripe S1 in FIG. 1, if data at physical address range D1 is corrupted, the data at physical address range D1 can be recovered by reading data at physical address ranges A1, B1, C1, and E1 in view of the redundancy information in parity block P1 (assuming the data is currently the same as when the parity block P1 was calculated). Thus, when a data block is recovered from parity, it is recovered by reading other blocks within a stripe, including parity, and then reconstructing it.

As the inventor(s) has/have appreciated, if a memory device fails in a large memory device array, parity-based recovery alone is impracticable for reconstructing lost data for several reasons, such as system performance and lengthy reconstruction times. For example, if a 16 terabyte (TB) memory device fails and the remaining memory devices of a memory device array are accessible at a rate of 40 MB/s, it can take about 4 days to complete reconstruction of the failed memory device using parity based RAID redundancy alone. This time period is marked not only by degraded performance for the data storage system, but is also marked by an increased susceptibility to data errors on non-failed memory devices of the memory device array. Therefore, while the use of a single memory device array is sufficient is some contexts, it is often less than ideal.

In view of these shortcomings, the inventor(s) has/have devised data storage techniques that utilize a first data storage device and a second data storage device to facilitate more efficient storage and recovery of data blocks than previously achievable. In addition to using parity information, the first and second data storage devices collectively store multiple copies of data. In this way, if data on one of the data storage devices is subsequently lost, some portions of it can be recovered from parity and other portions of it can be recovered from a copy stored in another location of the first or second storage device. These data storage and recovery techniques are more efficient than previous implementations.

Figure 2:
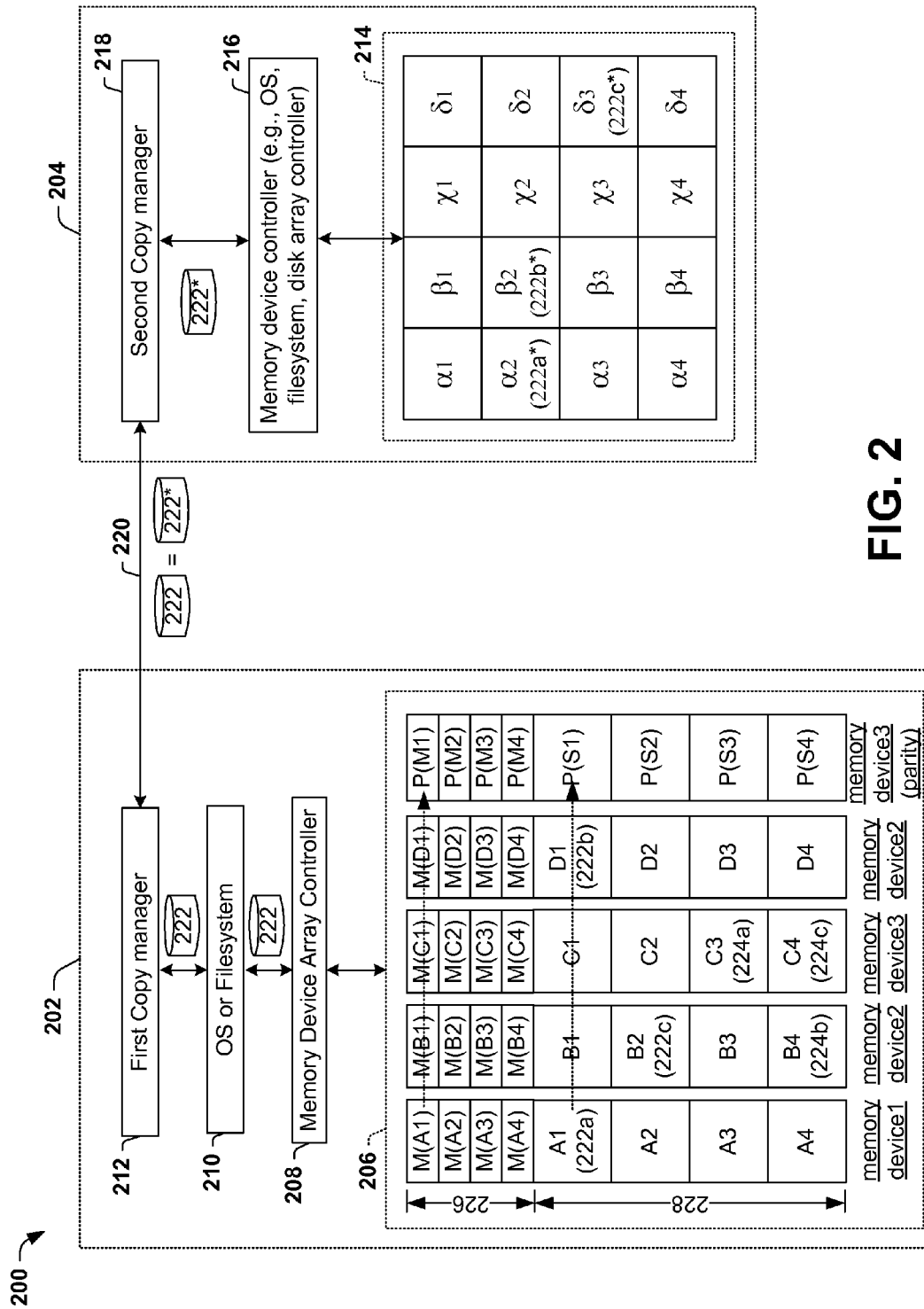
FIG. 2 is a block diagram illustrating a data storage system having a first and second data storage devices and copy managers to manage multiple copies of data stored therein.

Turning now to FIG. 2, one can see an embodiment of a data storage system 200 that facilitates improved efficiency by employing a first data storage device 202 and a second data storage device 204. As will be appreciated in more detail below, the first data storage device 202 often includes a memory device array 206, a memory device array controller 208, a file system or operating system (OS) 210, and a first copy manager 212. The second data storage device 204 includes a data storage element 214, a memory device controller 216, and a second copy manager 218. The first and second copy managers 212, 218 work in coordinated fashion with each other and the memory device controllers 208, 216 to manage multiple copies of data and shield another layer(s) from the intricacies involved with managing multiple copies of data. By storing multiple copies of data on the first and second data storage devices 202, 204, the data storage system 200 facilitates efficient data storage and retrieval.

During operation, the first copy manager 212 establishes a connection with the second copy manager 218 via a network link 220. Often, one of the copy managers (e.g., the first copy manager 212) has an original data set 222 and requests the other copy manager (e.g., the second copy manager 218) to setup and manage a copy of the original data set 222*. The copy managers 212, 218 manage these data sets 222, 222* via logical addresses. Note that although the copy of the original data set 222* is illustrated as being a copy of the entire original data set 222, this is not necessary—in other embodiments, the copy of the original data set 222* can include less than all data blocks of the original data set 222.

In the first data storage device 202, upon receiving the logical addresses for the original data set 222, the memory device array controller 208 writes the original data set 222 to the memory device array 206 as original data blocks 222a, 222b, and 222c, which are written to physical address ranges A1, D1, and B2, respectively. Similarly, in the second data storage device 204, the memory device controller 216 writes the copied data set 222* to the data storage element 214 as copied data blocks 222a*, 222b*, and 222c*, which are written to physical address ranges α2, β2, and δ3, respectively. Because the data sets 222, 222* are written based on physical addresses, the data blocks can be scattered over non-contiguous physical addresses, as illustrated. In this way, data is stored at least twice in the data storage system 200—once in the memory device array 206 and another time in the other data storage element 214. Note that for purposes of illustration, the memory device array 206 also includes a different data set (e.g., different original data blocks 224), which has not been copied to the data storage element 214.

To facilitate efficient data reconstruction, respective memory devices in the memory device array 206 are partitioned between at least one metadata zone 226 and at least one data zone 228. The metadata zone(s) 226 store metadata units (e.g., metadata unit M(A1)) and the data zone(s) 228 store data blocks (e.g., data block 222a, which is stored at physical address range A1). In FIG. 2's example, the metadata zones 226 and data zones 228 are separate contiguous physical address ranges on respective memory devices. Because these physical address ranges are contiguous, this arrangement reduces disk seek times when metadata units and/or data blocks are retrieved from disks, thereby allowing faster reconstruction than previously available.

To promote proper data block and metadata unit storage, parity blocks are calculated for the respective data stripes in the memory device array 206. These parity blocks can, for example, be based upon logical XOR operations, checksums, reed-solomon codes, hash values, or other types of data integrity schemes. For example, in the memory device array 206, parity block P(M1) is calculated based on metadata blocks M(A1), M(B1), M(C1) and M(D1). In addition, parity block P(S1) is calculated based on data in physical address ranges A1, B1, C1, and D1. Although the illustrated example depicts parity blocks calculated for horizontal data stripes, data stripes can have other arrangements, such as vertical stripes, diagonal stripes, TETRIS-like shapes (e.g., L-shapes, T-shapes, etc.), and/or more complex arrangements—all of which are contemplated as falling within the scope of this disclosure provided herein.

Within respective metadata zones 226 on a memory device, the metadata units correspond to respective data blocks. For example, for memory device 1 in the memory device array 206, metadata unit M(A1) corresponds to original data block 222a (located at physical address range A1). Respective metadata units often include a logical address along with a signature identifier. The logical address in the metadata unit is often used by another layer(s) to refer to the original data block 222a in the logical address space. The copy manager 212 also uses this logical address to keep track of any copies of the original data block which might be stored on other data storage devices. For example, metadata unit M(A1), which corresponds to physical address range A1, includes a logical address that can be used by the first copy manager 212 to access the copied data block 222a* which is stored at physical address range α2 in the second data storage device 204.

Although, in general, the first and second data storage devices can be any type of data storage device, in some embodiments the first and/or second data storage devices 202/204 include a second memory device array.

In addition to the above mentioned metadata unit components, respective metadata units can also include other lost-write relevant information, such as a consistency point count (CP count) and a tuple formed using Generation ID and a random number. CP count refers to a unique identifier which indicates the checkpoint number (or CP count) at which the block was written. The Generation ID, which refers to an identifier which can be used to keep track of the generation of a physical block, is generally created by the memory device array controller. Along with the random number, the Generation ID forms part of the "lost write" relevant information. Accordingly, in an embodiment having a 4-byte flexvolume identifier, an 8-byte flexvolume offset, an 8-byte checksum, and 12 bytes for lost-write relevant information, respective data blocks have a corresponding metadata unit that is 32 bytes in size.

Figure 3:
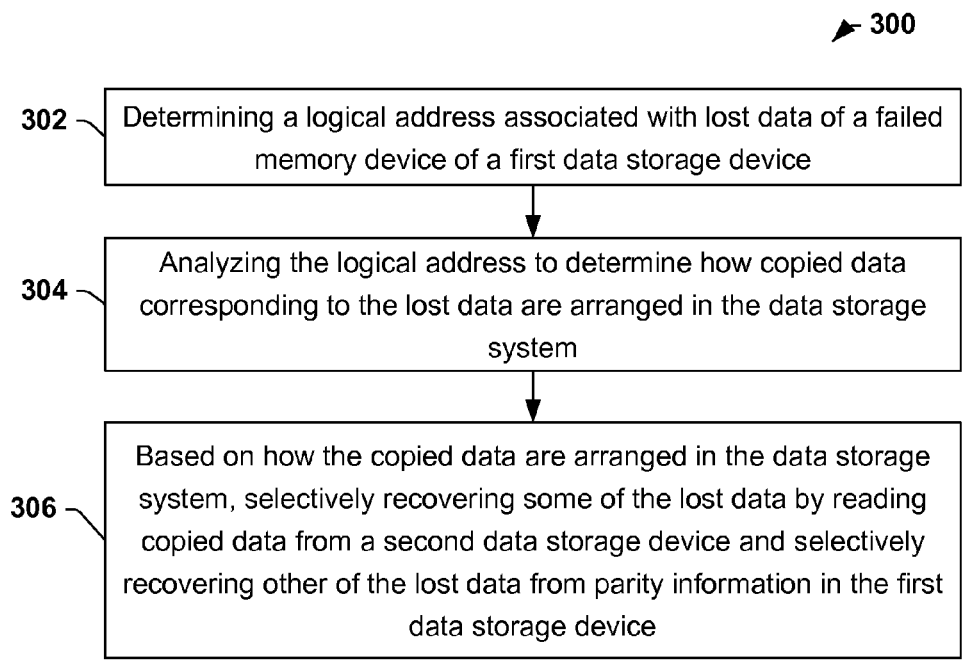
FIG. 3 is a flow diagram illustrating an embodiment for a method of recovering data blocks of a failed memory device of a memory device array.
Figure 4:
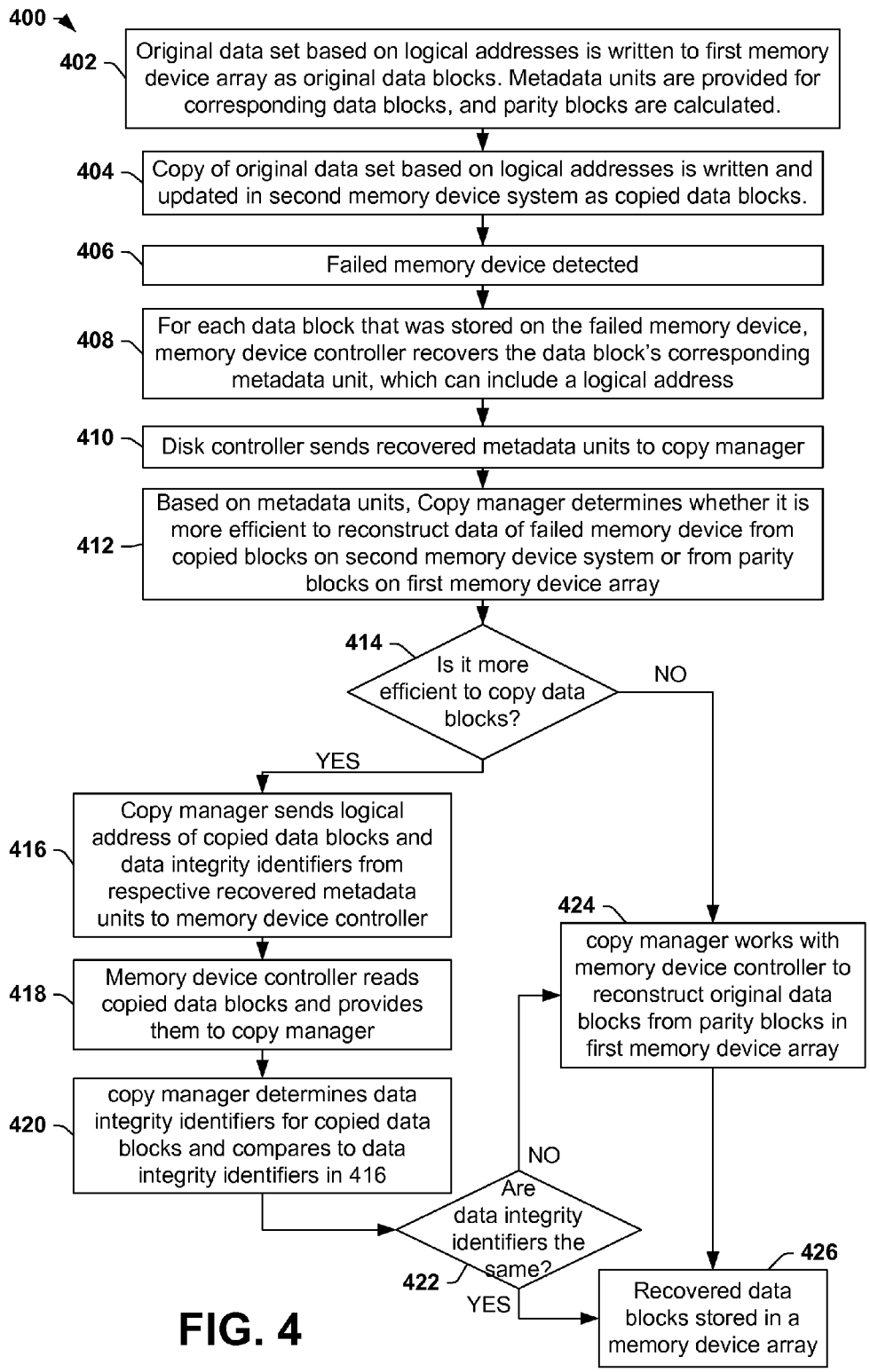
FIG. 4 is a flow diagram illustrating a more detailed embodiment for a method of recovering data blocks of a failed memory device of a memory device array.

As will be appreciated, this technique of providing metadata units with multiple copies of data facilitates efficient retrieval of lost data from a failed memory device. FIG. 3 illustrates a data recovery method 300 that is more general in some respects, and FIG. 4 shows a more particular methodology 400. While these methods are illustrated and described below as a series of acts or events, the present disclosure is not limited by the illustrated ordering of such acts or events. For example, some acts may occur in different orders and/or concurrently with other acts or events apart from those illustrated and/or described herein. In addition, not all illustrated acts may be required. Further, one or more of the acts depicted herein may be carried out in one or more separate acts or phases.

Referring now to FIG. 3, one can see a method 300 of recovering lost data from a failed memory device of a memory device array. Upon failure of the memory device, data stored on the failed memory device becomes lost until it can be recovered in some manner.

The method 300 starts at 302, where a logical address is detected. The logical address is associated with lost data of a failed memory device of a first data storage device.

At 304, the logical address is analyzed to determine how copied data corresponding to the lost data are arranged in the data storage system.

At 306, based on how the copied data are arranged in the data storage system, some of the lost data is selectively recovered by reading copied data from a second data storage device. Also based on how the copied data are arranged in the data storage system, other of the lost data is selectively recovered from parity information in the first data storage device.

FIG. 4 illustrates a more particular methodology 400. To illustrate a specific example of how FIG. 4's method could be implemented, FIG. 4 is discussed with reference to a series of functional diagrams in FIGS. 5-9. For reference, various blocks from FIG. 4's methodology are reproduced at the top of FIGS. 5-9 to depict how one example of the methodology 400 can be implemented. It is to be appreciated, however, that although the functional diagrams of FIGS. 5-9 illustrate one example of how method 400 can be carried out, these functional diagrams are not meant to be limiting in that there are other manners in which the method 400 can also be carried out.

Figure 5:
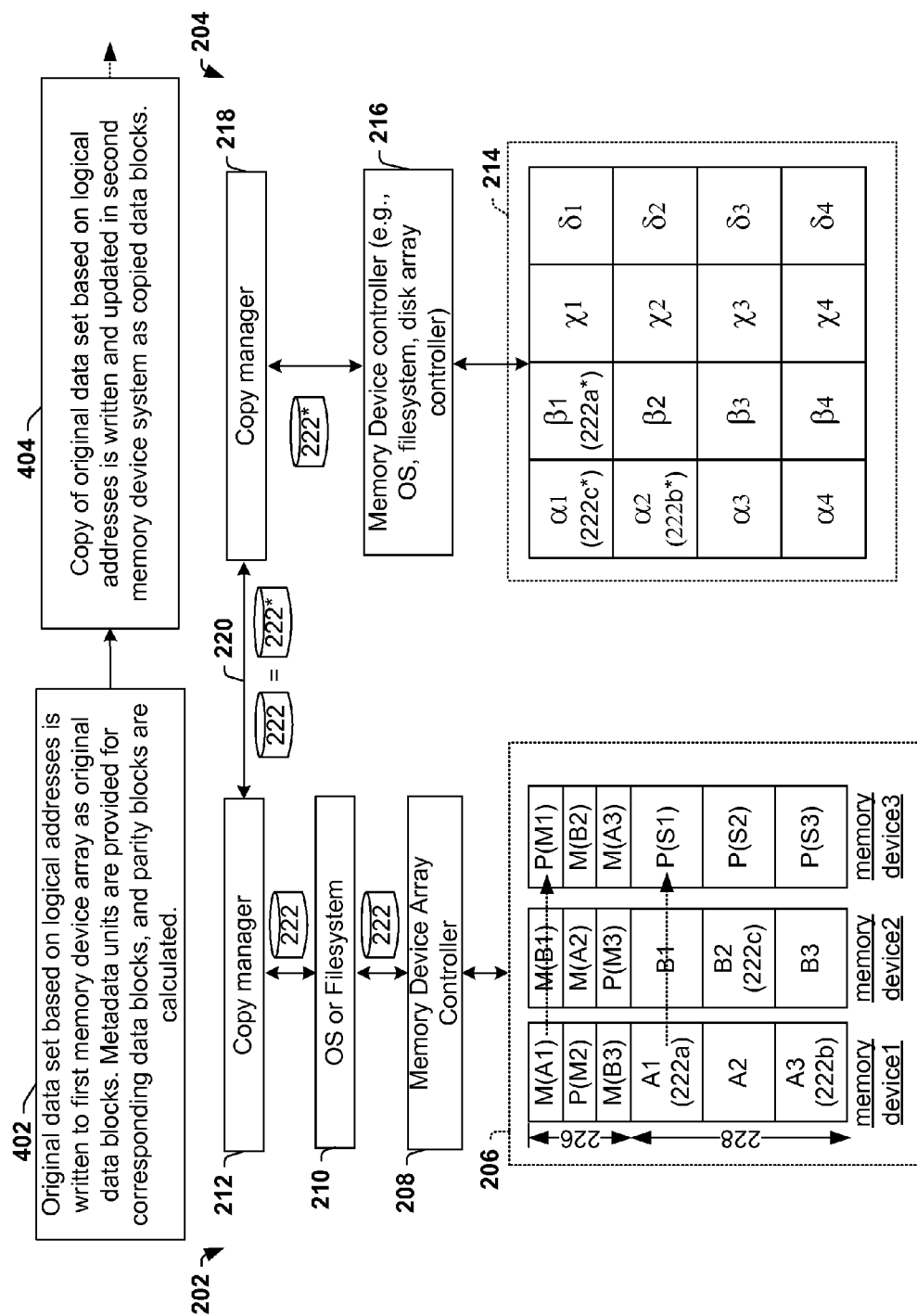
FIGS. 5-9 are functional diagrams illustrating recovering data blocks of a failed memory device of a memory device array, such as may be consistent with FIG. 4's flow diagram, for example.

In FIG. 5 (e.g., 402, 404 in FIG. 4), an original data set 222 based on logical addresses is written to a memory device array 206 as original data blocks (222a, 222b, 222c). Metadata units (e.g., M(A1)) are provided for corresponding original data blocks (e.g., 222a). Parity blocks (e.g., P(M1)) are also calculated for stripes of the memory device array 206. A copy of the original data set 222* is written and updated in second data storage device 204 as copied data blocks (222a*, 222b*, 222c*). Note that the copy of the original data set can be written at some later point in time. The copy doesn't have to be necessarily written synchronously. In a background manner, depending upon how the filesystem-level/logical mirroring schedule has been configured an attempt would be made to copy changed blocks of a data set to the destination storage system which stores the copy.

In many cases, the original data set 222 may change dynamically. For example, in some cases, the entire original data set 222 may change practically at all once, requiring each copied data block to be updated. These cases may be thought of in some respects as taking an initial "snapshot", where all pixels are recorded over a short time interval. In other cases, however, large portions of the original data set can remain unchanged and merely a small portion of the original data set 222 changes. These other cases, may be thought of in some respects as changing just a few pixels of the initial "snapshot", rather than taking an entirely new shapshot. Consequently, in these other cases, it may be much quicker to update corresponding small portions of the original data set.

Figure 6:
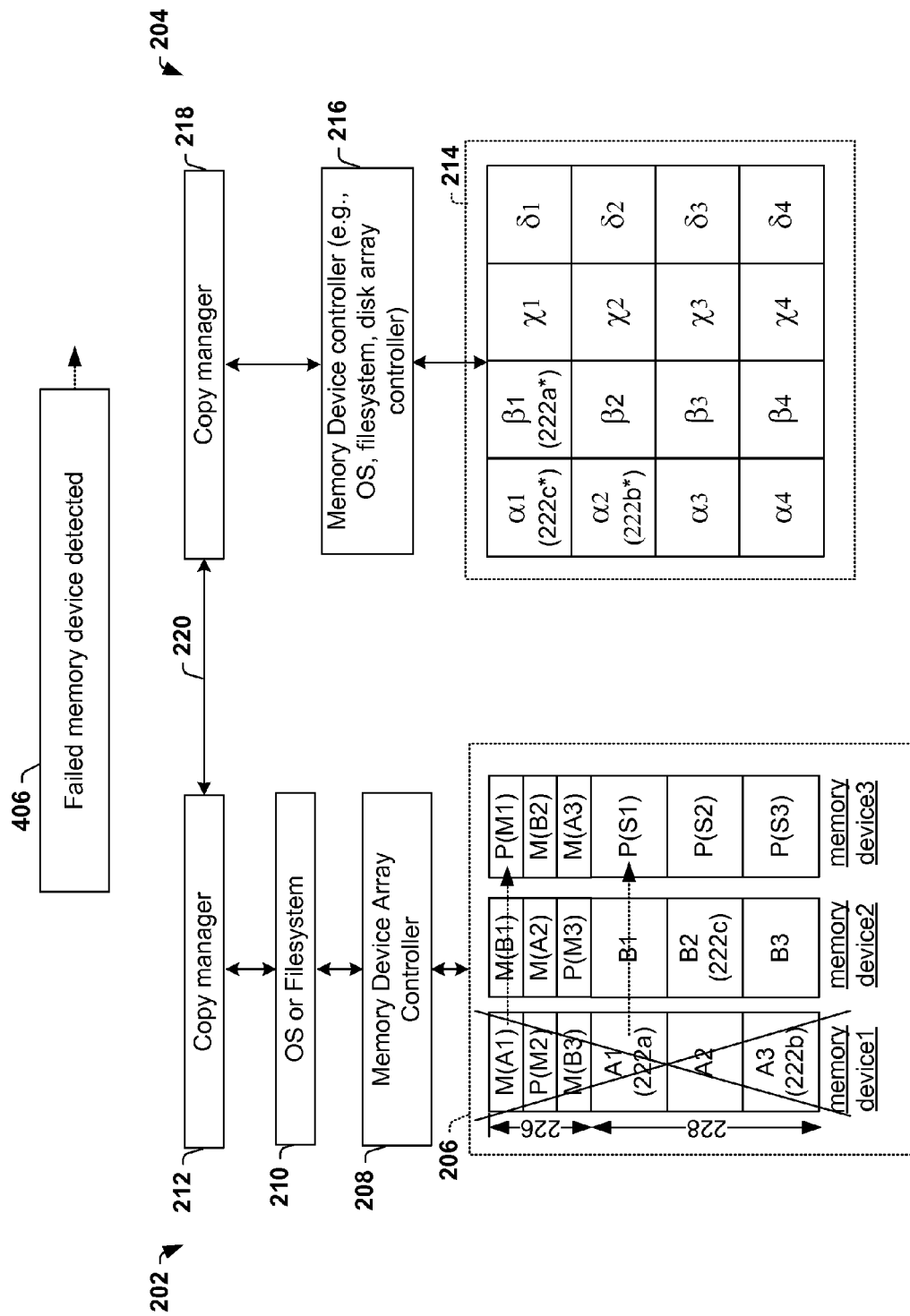

In FIG. 6 (e.g., 406 in FIG. 4), a failed memory device is detected. In this example, Data Memory device 1 in the memory device array 206 is assumed to have failed (and thus has a large "X" drawn thereover). Therefore, the original data blocks 222a, 222b stored on this memory device are lost, causing portions of the original data set 222 to be lost until they are recovered in some manner.

Figure 7:
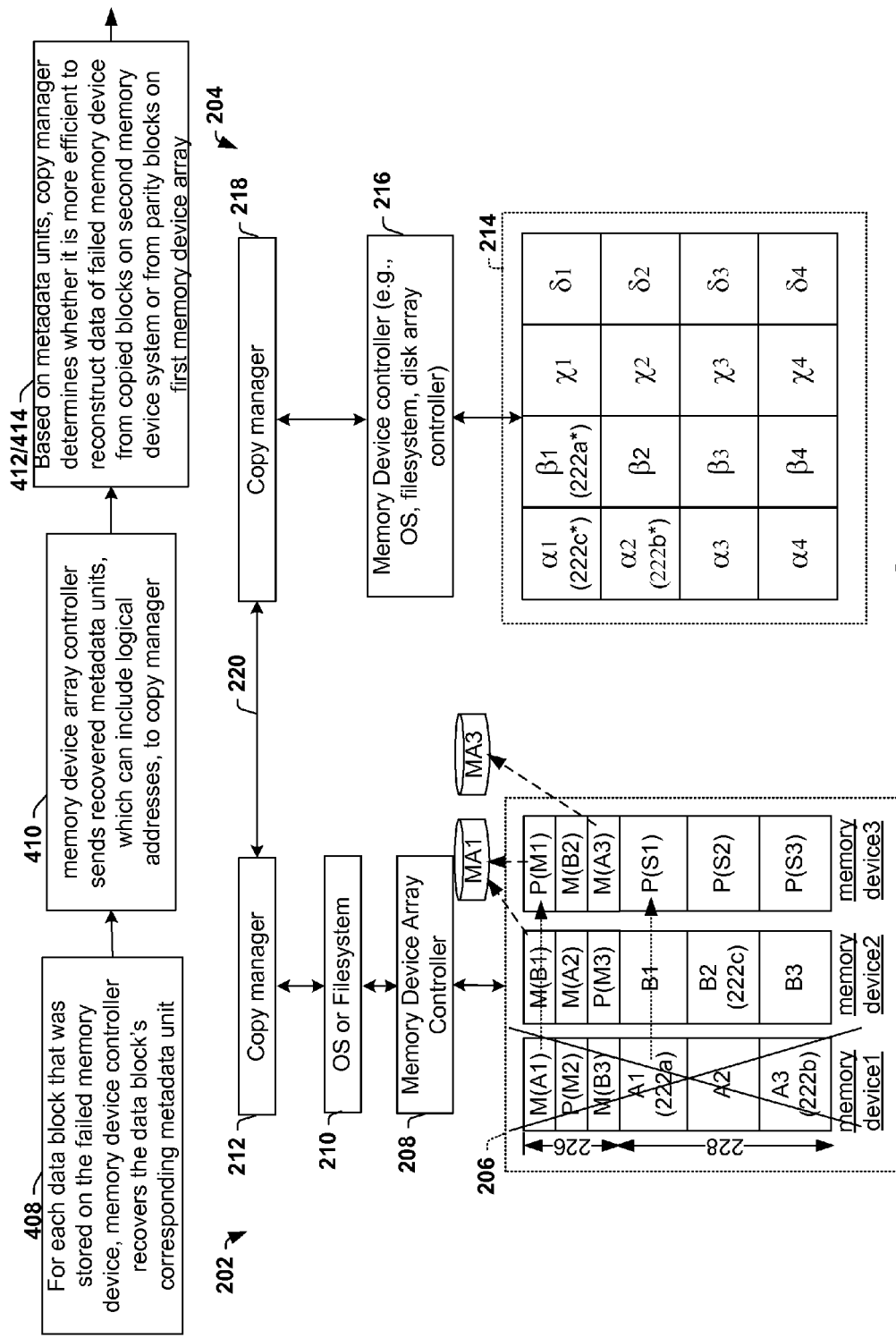

In FIG. 7 (e.g., 408-414 in FIG. 4), the memory device array controller 208 facilitates recovery of metadata units corresponding to respective data blocks from the failed memory device. If a metadata unit is available on a non-failed memory device, the memory device array controller 208 can simply read the metadata unit from the non-failed memory device. For example, for original data block 222b, its corresponding metadata unit M(A3) is stored on Data Memory device 3 and can simply be read from Data Memory device 3. If, however, a required metadata unit is on the failed memory device, it is recovered from parity. For example, because metadata unit M(A1) and original data block 222a are both on Data Memory device 1, metadata unit M(A1) is recovered using parity block P(M1) and other metadata units in the metadata stripe.

After all the metadata units are recovered (or as the metadata units are gradually recovered), the memory device array controller 208 sends the recovered metadata units to the first copy manager 212. Based on these recovered metadata units and the logical addresses stored therein, the copy manager discerns how copied data blocks are stored in the data storage system—for example, to what extent the copied data blocks are "scattered" over the physical address space. The first copy manager 212 determines whether it is more efficient to reconstruct the original data blocks of the failed memory device from copied blocks on the second data storage device 204 or whether it is more efficient to reconstruct the original data blocks of the failed memory device from parity blocks on the memory device array 206. When the second data storage device 204 comprises a hard disk (e.g., a second disk array), it will tend to be more efficient to reconstruct from copied data if the copied data blocks are in long contiguous chains on the hard disk. Such long chains tend to reduce disk seek times, thereby speeding data reconstruction. Thus, if the second data storage device 204 comprises a disk array, this disk array may exhibit a layout similar to that of the disk array 206.

As a more specific example, consider a case in which a 16 TB disk fails and in which the second data storage device 204 is a disk array. Assuming the failed disk has $10^9$ data blocks of 4K each, a determination of how to best reconstruct the lost data on the failed disk is carried out. Although all blocks could be recovered from parity, this is often less than ideal because doing so requires multiple reads (e.g., each data block of a stripe must be read), and a calculation of parity must also be carried out. Therefore, because recovery from parity is computationally expensive, it is often more efficient to use a blend of reading lost data from copied data blocks as well as recovering lost data from parity. For example, if 80% of the copied blocks are on a contiguous region of the second storage device, these copied data blocks could be read extremely efficiently because the read heads of the disk could read them sequentially. Therefore, this 80% of the lost data is recovered from the contiguous chains of copied data blocks on the second disk. As for the remaining 20% of lost data blocks, these can be reconstructed from parity, even though it is less efficient.

Figure 8:
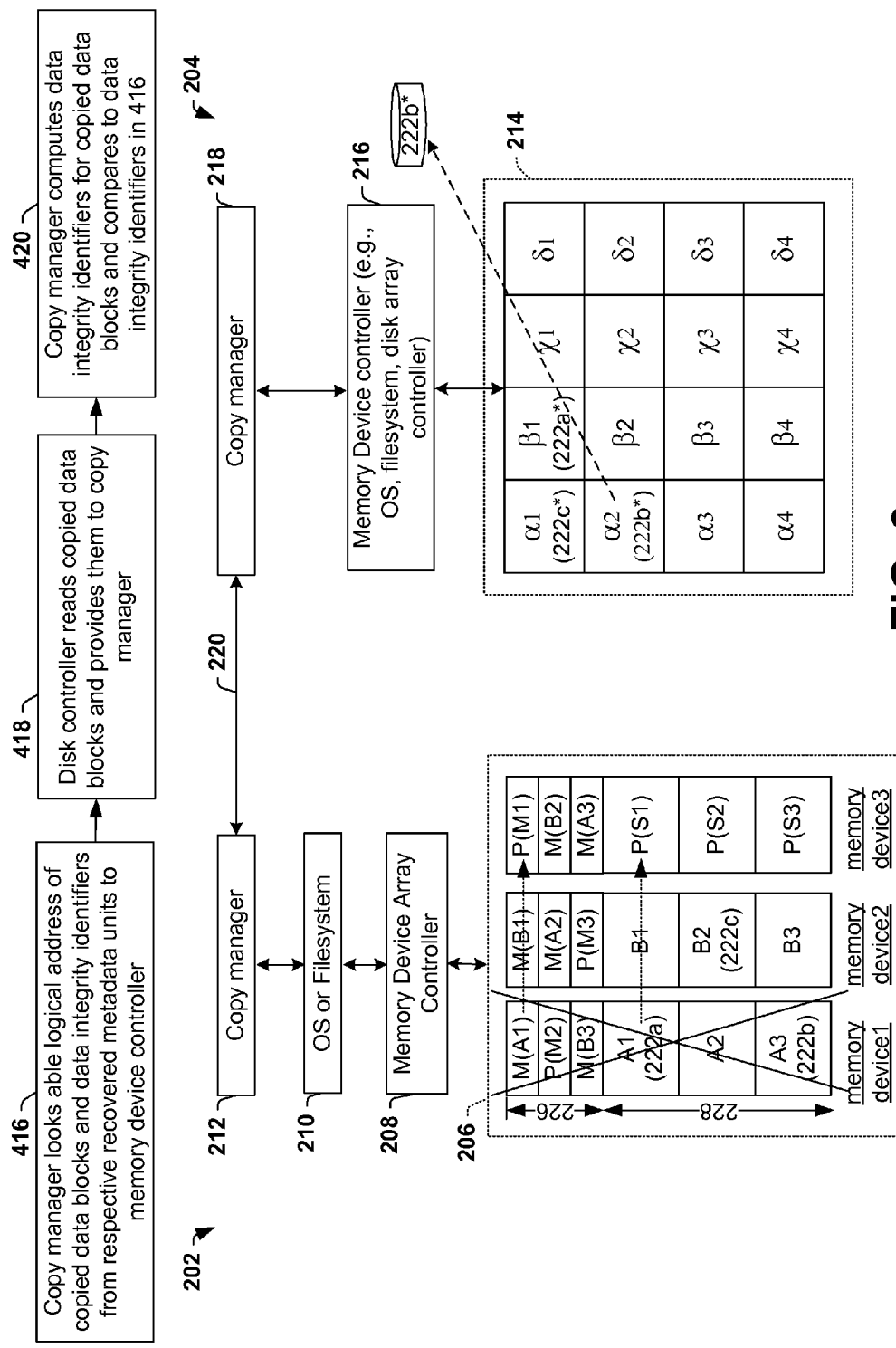

As illustrated in FIG. 8 (e.g., 416-420 in FIG. 4), if it is more efficient to reconstruct the lost original data blocks (e.g., original data block 222b in memory device array 206) from copied data blocks (e.g., copied data block 222b* in the second data storage device 204), the first copy manager 212 looks up a logical address of the copied data blocks based on the logical address in a metadata unit, for example by using a table lookup. The first copy manager 212 then sends the logical addresses of the copied data blocks and their respective first signature identifiers (which were contained in the metadata units) to the copy manager 218 and memory device controller 216. The memory device controller 216 reads the copied data blocks (e.g., copied data block 222b*) and transfers the copied data blocks to the copy manager 218. The copy manager 218 verifies that the first signature identifier of the copied data blocks read from the second data storage device 204 is the same as provided by the first copy manager 212 (e.g., is the same as a second signature identifier stored in the metadata units in the memory device array 206). Alternatively, the memory device controller 216 verifies the first and second signature identifiers are the same.

Figure 9:
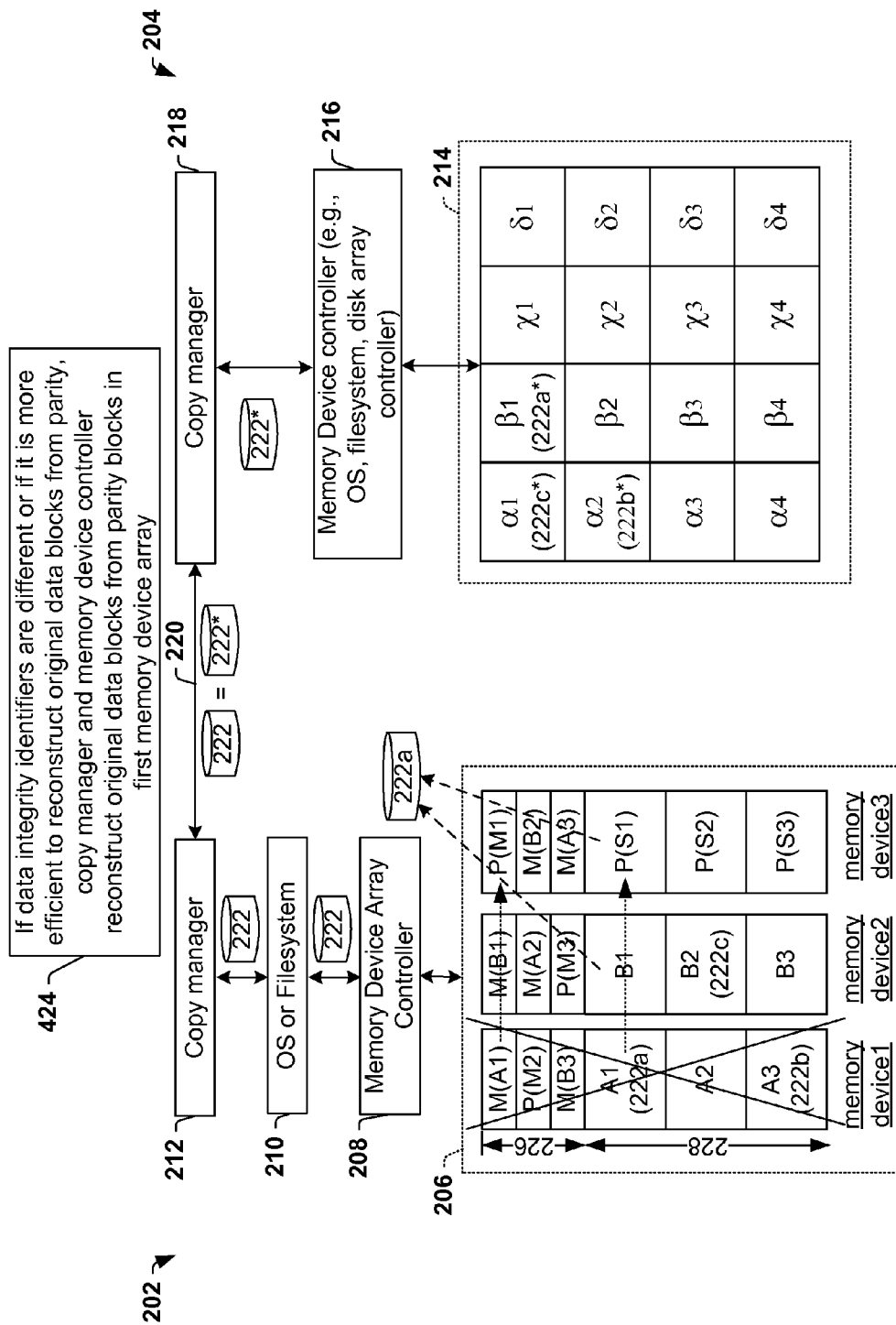

In FIG. 9 (e.g., 424 in FIG. 4), if the first and second signature identifiers are different (or if it is more efficient to reconstruct the lost original data blocks from parity—"NO" in 414), the memory device array controller 208 and optionally the first copy manager 212 reconstruct the original data blocks from parity blocks in the memory device array 206. For example, if it is inefficient to transfer copied data block 222a* from the data storage element 214, original data block 222a is recovered using parity block P(S1) in the memory device array 206.

Figure 10:
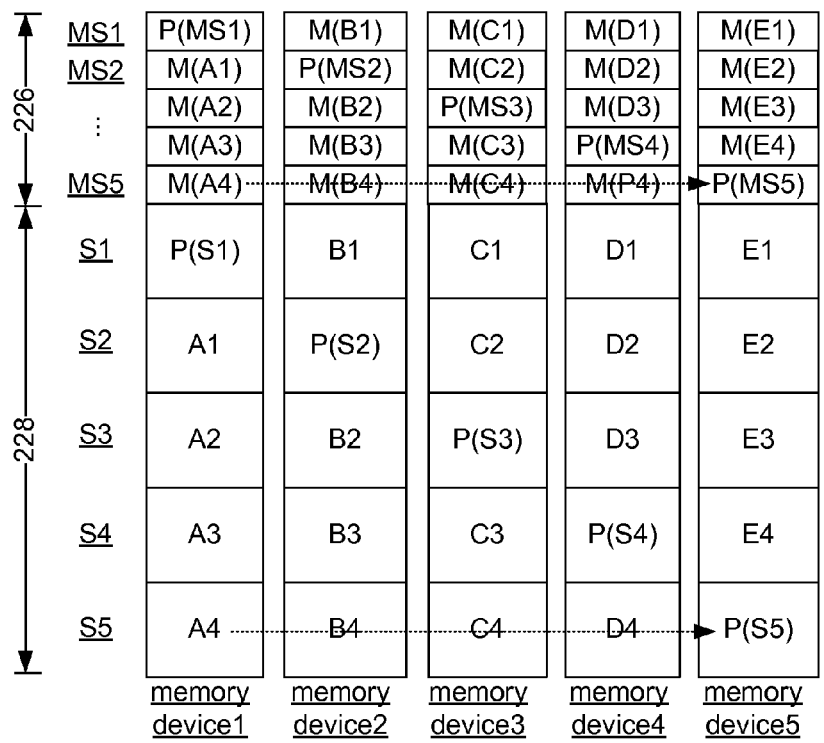
FIG. 10 illustrates an example of a layout for arranging data blocks, metadata units, and parity blocks.

Although some illustrative methods and systems have been described above, it will be appreciated that these described methods and systems are only examples and other legal equivalents are contemplated as falling within the scope of this disclosure. For example, although FIG. 2 discussed above illustrated one layout for data zones 228, metadata zones 226, and parity blocks, other layouts are also possible. For example, in contrast to FIG. 2 which illustrated an example with a separate parity memory device, FIG. 10 illustrates an example where the parity blocks (P(S1)-P(S5)) are interleaved with data blocks rather than stored on a separate parity memory device.

Figure 11:
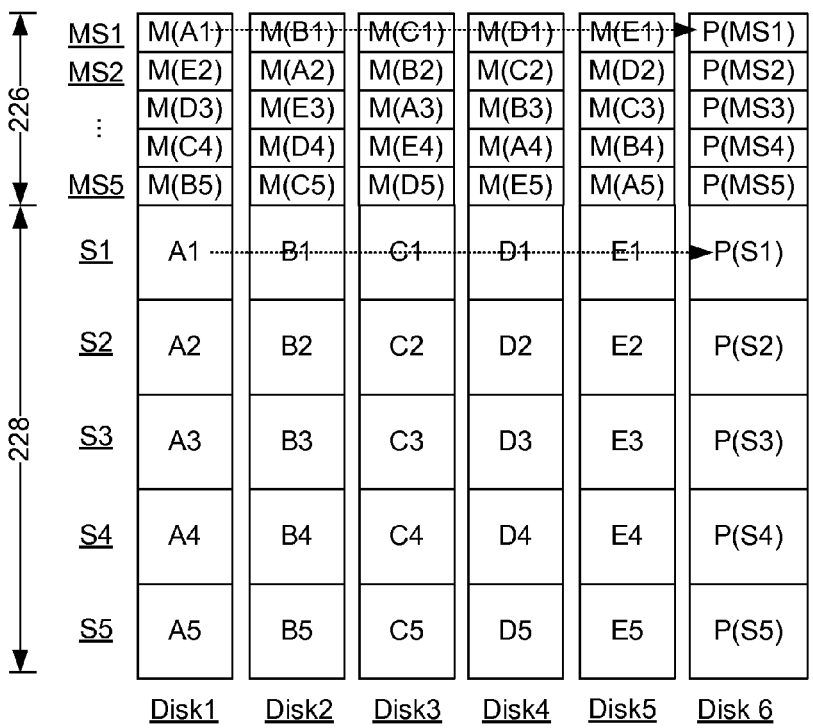
FIG. 11 illustrates an example of a layout for arranging data blocks, metadata units, and parity blocks.

FIG. 11 illustrates another alternative embodiment where the metadata units are rotated between different memory devices that comprise disks. Thus, unlike FIG. 2 where a metadata unit and its corresponding original data block are on the same disk, FIG. 11 illustrates an example where at least some, if not all, metadata units are on separate disks from their corresponding original data blocks. For example, metadata unit M(A2) is on a different disk from its corresponding data block A2. This organization offers the same protection level as FIG. 2 but has an advantage in that a fraction of metadata units has to be reconstructed from parity blocks in the case of a disk failure. For example, if a disk fails in FIG. 11's example, ⅕ of the metadata units have to be reconstructed from parity and the rest of the metadata units can be read in parallel from the non-failed disks. This approach offers the advantage that metadata units can be read about r/2 times faster compared to the FIG. 2's approach (where "r" is the number of disks in the disk array).

Figure 12:
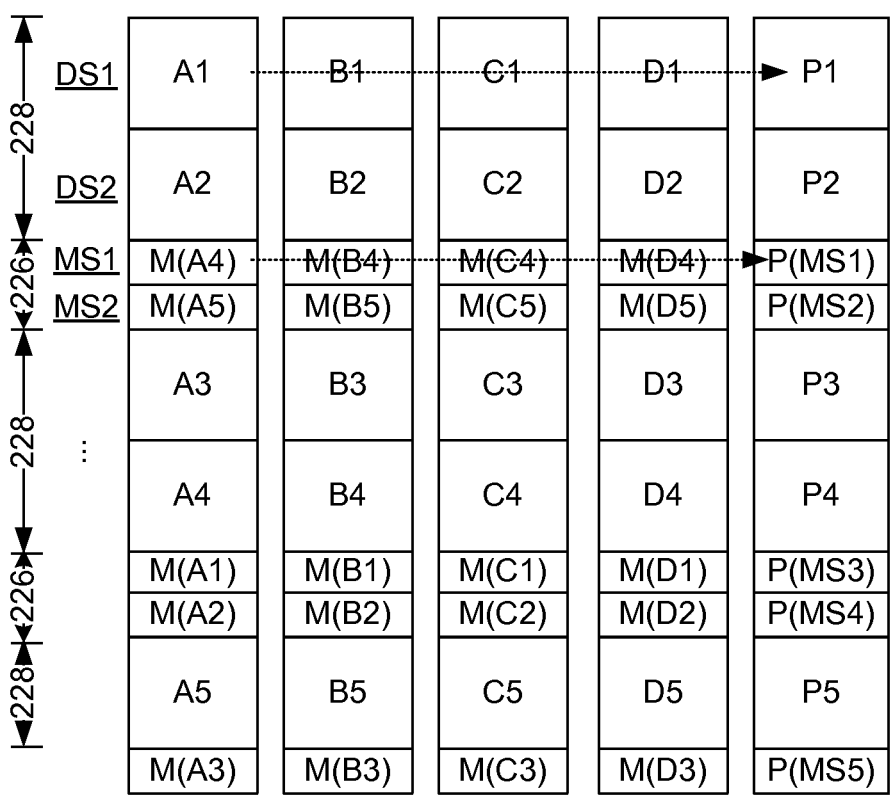
FIG. 12 illustrates an example of a layout for arranging data blocks, metadata units, and parity blocks.

FIG. 12 illustrates still another embodiment of a layout using alternating data zones 228 and metadata zones 226. The underlying idea here is that the cost of additional disk seek is reduced by locating metadata zones 226 closer to the actual data blocks. In many implementations, a good layout will provide low update overhead. In other words, the cost (e.g., in terms of additional i/os required) for updating the metadata blocks is a relatively small percentage of the overall cost of performing a write operation. Since metadata units don't have to be absolutely synchronized with their corresponding data units, techniques such as write-back caching can be used for this purpose.

Apart from the metadata layouts discussed above, log based schemes, which treat the metadata zone as an append-log can also be used. Still another alternative is to update the metadata units in the background, via a scanner (e.g., by piggybacking on the media scan scanner). The underlying idea behind this approach is that a large fraction of a disk's capacity can be locked by snapshotted data and hence changes only slightly over time. For example, in an embodiment where the snapshotted data is stored as part of one or more data structures, the data structures can include a field that enables write access when certain conditions are met (e.g., the field can lock the snapshotted data). Still another alternative is to maintain multiple copies of metadata units on different disks. This essentially eliminates the parity update overhead, albeit at a higher storage overhead.

Therefore, it will be appreciated that combinations of these and other data layout schemes may be implemented in the context of the concepts disclosed herein. Also, it will be appreciated that data storage systems can include one disk array using one type of data layout, and another disk array using another type of data layout.

It will be appreciated that processes, architectures and/or procedures described herein can be implemented in hardware, firmware and/or software. It will also be appreciated that the provisions set forth herein may apply to any type of special-purpose computer (e.g., file server, filer and/or storage serving appliance) and/or general-purpose computer, including a standalone computer or portion thereof, embodied as or including a storage system. Moreover, the teachings herein can be configured to a variety of storage system architectures including, but not limited to, a network-attached storage environment and/or a storage area network and disk assembly directly attached to a client or host computer. Storage system should therefore be taken broadly to include such arrangements in addition to any subsystems configured to perform a storage function and associated with other equipment or systems.

Figure 13:
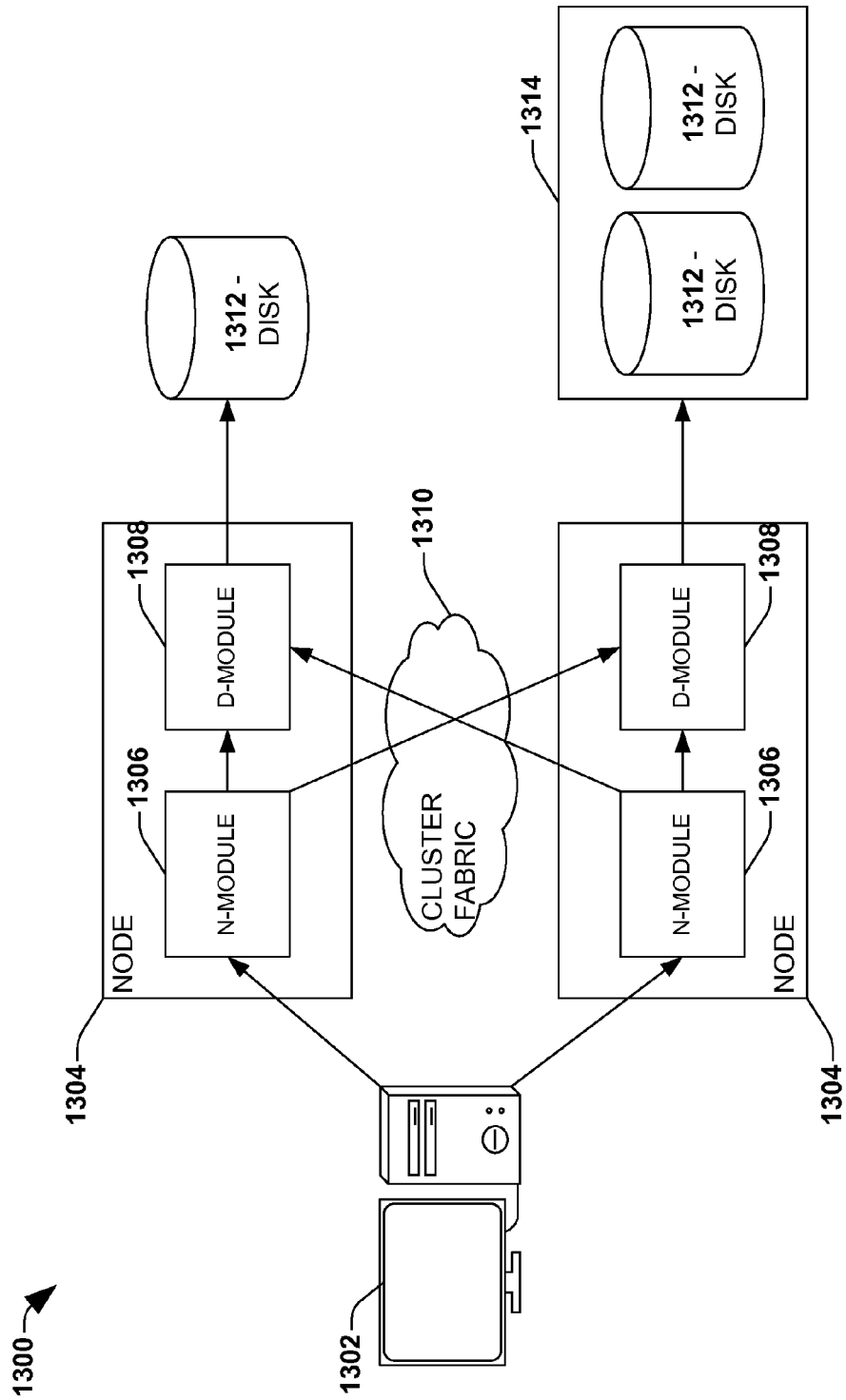
FIG. 13 is an illustration of an embodiment of a clustered computing environment.

FIG. 13 is an illustration of an example embodiment 1300 of a clustered computing environment, such as a data storage and management system in which the previously discussed data storage system 200 may reside. In this embodiment, nodes 1304 are interconnected as a cluster to provide data storage and management services, such as to an enterprise, for example. A node in a data storage and management network cluster can be a device attached to the network as a connection point, redistribution point or communication endpoint. A node may be capable of sending, receiving, and/or forwarding information over a network communications channel, and could comprise any device that meets any or all of these criteria. One example of a node may be a data storage and management server attached to a network.

As illustrated in the embodiment 1300, nodes 1304 can comprise various functional components that coordinate to provide distributed storage architecture for the cluster. Nodes can comprise a network module 1306 (e.g., N-blade) and a disk module 1308 (e.g., D-blade). Network modules 1306 can be enabled to allow the node 1304 to connect with clients 1302, for example, allowing the clients 1302 to access data stored in the data storage system. Disk modules 1308 can be enabled to connect one or more storage devices, such as disks 1312 or disk arrays 1314 (e.g., disk array 206), to the node 1304. The nodes 1302 can be interconnected by a cluster switching fabric 1310, for example, allowing respective nodes in the cluster access to data on a disk 1312 connected to a different node in the cluster. Thus, the previously described functionality of the disk array controller (e.g., 208) and copy manager (e.g., 206) can reside in the network module 1306, disk module 1308 or combinations thereof.

It should be appreciated that, while the embodiment 1300 illustrates an equal number of N and D-modules, other embodiments may comprise a differing number of these modules. For example, there may be a plurality of N and/or D modules interconnected in a cluster that does not have a one-to-one correspondence between the N and D-modules. Further, a client 1302 may be a general purpose computing device, such as a desktop personal computer, configured to network with a node 1304 in the cluster. For example, respective clients 1302 networked to a cluster may request services of a node 1304 in the cluster, and the node 1304 can return results of the requested services to the client 1302. Often, the client 1302 can access a data storage system (e.g., data storage system 200) through an interface comprising the other layer 118, such that the network module 1306 and disk module 1308 shield the client 1302 from the details of managing multiple disks.

Figure 14:
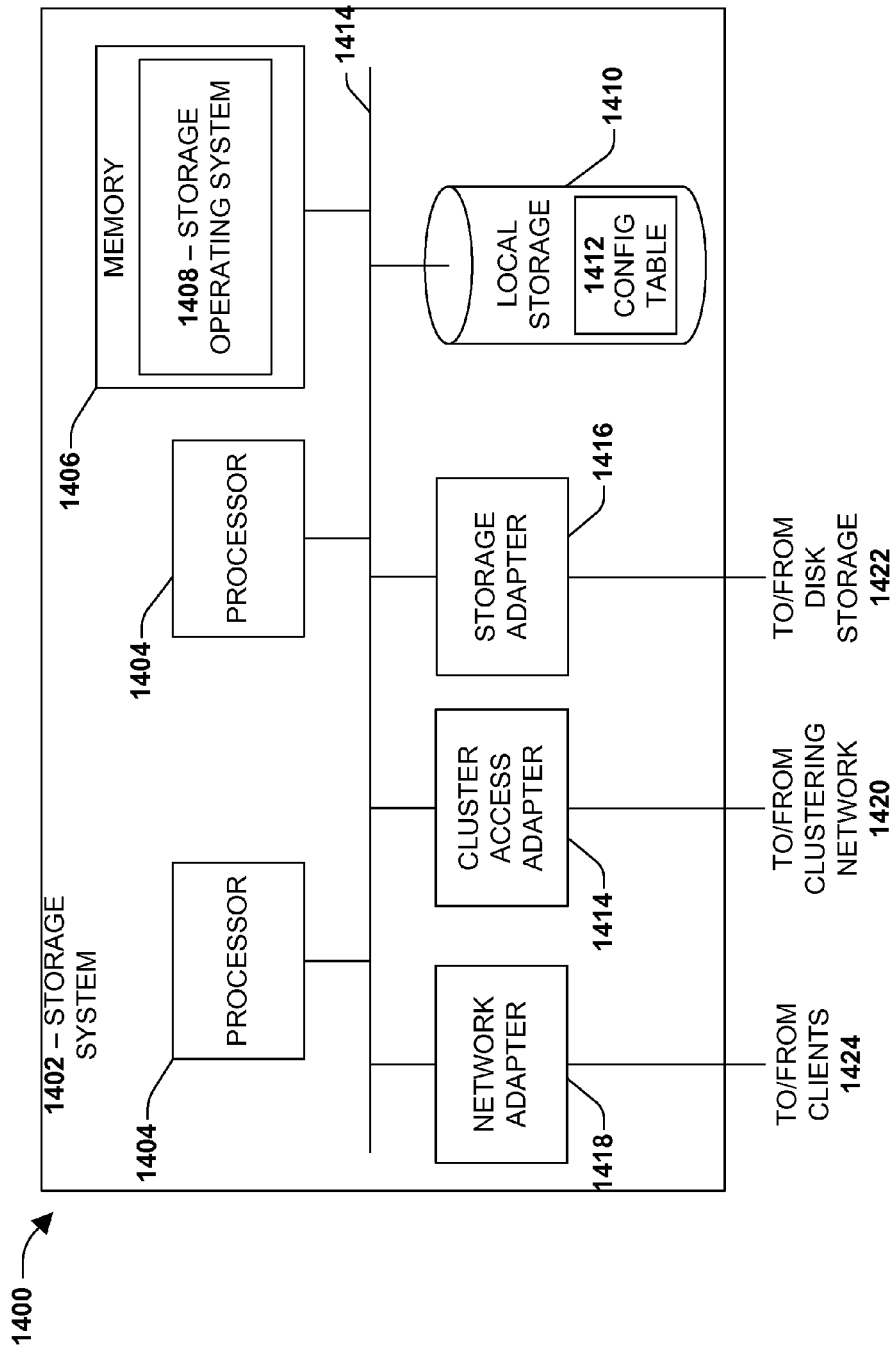
FIG. 14 is a block diagram illustrating an embodiment of an example environment where one or more of the provisions set forth herein may be implemented.

FIG. 14 is a block diagram of an embodiment of an environment 1400, including a storage system 1402, such as a node in a clustered storage system, that may implement one or more of the techniques and/or systems, described herein. The storage system 1402 may be a computing device that provides access to files stored on mass storage devices, such as disk storage 1422, for example, in a disk array (e.g., disk array 206). It will be appreciated that the techniques and systems, described herein, are not limited by this embodiment. For example, disk storage 1422 may comprise any type of mass storage devices, including but not limited to magnetic disk drives, flash memory, and any other similar media configured to store information, including data and parity information.

The storage system 1402 includes one or more processors 1404, a memory 1406, a network adapter 1418, a storage adapter 1416, and a cluster access adapter 1414, interconnected by a system bus 1414. The storage system 1402 also includes a storage operating system 1408 that can, for example, implement a Redundant Array of Independent (or Inexpensive) Disks (RAID) optimization system to optimize the reconstruction process of a failed disk in the disk storage 1422.

In the example environment 1400, memory 1406 may include storage locations that are addressable by the processors 1404 and adapters for storing related software program code and data structures. The processors 1404 and adapters may, for example, include processing elements and/or logic circuitry configured to execute the software code and manipulate the data structures. The storage operating system 1408, portions of which are typically resident in memory and executed by the processing elements, functionally organizes the storage system 1402 by, inter alia and in one embodiment, invoking storage operations in support of a file service implemented by the storage system 1402. It will be apparent to those skilled in the art that other processing and memory means, including various computer readable media, may be used for storing and executing program instructions pertaining to the inventive techniques described herein.

The network adapter 1418 includes the mechanical, electrical and signaling circuitry needed to connect the storage system 1402 to a client 1424 (e.g., the client 1302 in FIG. 13) over a computer network, which may comprise, among other things, a point-to-point connection or a shared medium, such as a local area network. The client 1424 may be a general-purpose computing device, such as a desktop computer, configured to execute applications. Moreover, the client 1424 may interact with the storage system 1402 in accordance with a client/server model of information delivery. For example, the client may request the services of the storage system (e.g., acting as a server), and the storage system may return the results of the services requested by the client, by exchanging packets using protocol formats, such as a Common Internet File System (CIFS) protocol or a Network File System (NFS) protocol, over the network.

The storage adapter 1416 cooperates with the storage operating system executing on the storage system 1402 to access information requested by the client 1424. The information may be stored on any type of attached array of writeable media such as magnetic disk drives, flash memory, and any other similar media configured to store information. In the example environment 1400, in one embodiment, the information can be stored in disk blocks on the disks 1422. The storage adapter 1416 includes input/output (I/O) interface circuitry that couples to the disks over an I/O interconnect arrangement, such as a conventional high-performance, Fibre Channel serial link topology. The information is retrieved by the storage adapter 1416 and, if necessary, processed by the processors 1404 (or the adapter 1416 itself) prior to being forwarded over the system bus 1414 to the network adapter 1418, where the information is formatted into a packet and returned to the client 1424.

In one embodiment, storage of information on disk storage 1422 can be implemented as one or more storage "volumes" that comprise a cluster of disks defining an overall logical arrangement of disk space. The disks 1422, within a volume are typically organized as one or more groups of RAIDs.

In one embodiment, to facilitate access to disks 1422, the storage operating system 1408 may implement a file system (e.g., write anywhere file system) that logically organizes the information as a hierarchical structure of directories and files on the disks. In this embodiment, respective files may be implemented as a set of disk blocks configured to store information, such as data or parity, whereas the directory may be implemented as a specially formatted file in which other files and directories are stored. In the example environment 1400, in one embodiment, the storage operating system 1408 may be the NetApp® Data ONTAP® operating system (available from NetApp, Inc., Sunnyvale, Calif.) that implements a Write Anywhere File Layout (WAFL®) file system.

The cluster access adapter 1414, in the storage system 1402, may comprise a plurality of ports devised to couple the storage system 1402 to other storage systems in a cluster of storage systems (e.g., as in the cluster of nodes in FIG. 13). In one embodiment, an Ethernet may be use as a clustering protocol and interconnect media for a clustering network 1420. It will be apparent to those skilled in the art that other types of protocols and interconnects can be used for a clustering network 1420, described herein. In an alternate embodiment, where an N-module and D-module may be disposed on separate storage systems or computers, the cluster access adapter 1414 can be used by the N/D-module to communicate with the other N/D-modules of the cluster.

Further, although the storage system 1402 is illustrated as a single unit in FIG. 13, it can have a distributed architecture. For example, the storage system 1402 can be implemented with multiple distributed storage servers. It can also include a physically separate network module (e.g., "N-module") and disk module (e.g., "D-module") (not shown), which communicate with other storage servers over an external interconnect. The N-module acts as a front-end of the storage system, exporting services to clients; and the D-module acts as the back-end, managing the underlying storage of the storage system. The N-module and D-module can be contained in separate housings and communicate with each other via network connections. Thus, the N-module and the D-module enable a storage server to be physically separated into multiple modules that can be distributed across a network.

In one embodiment, an administrator of the example environment 1400 may input via the client 1418, for example, criteria regarding when electronically addressed non-volatile memory (e.g., flash memory) should be used to store kernel in-memory data caches that comprise user space persistently stored data. For example, an administrator may input a command that, effective immediately, all or a percentage of kernel in-memory data caches that comprise user space persistently stored data should be stored in electronically addressed non-volatile memory. Alternatively, the administrator may input a command rule providing that the most recently used or the most frequently accessed kernel in-memory data caches that comprise user space persistently stored data be stored in electronically addressed non-volatile memory, for example. This may also, for example, factor-in/be a function-of the amount of RAM available. For example, where less RAM is available or vacant, more kernel in-memory data caches that comprise user space persistently stored data may be stored in electronically addressed non-volatile memory and vice-versa.

In some embodiments, methods described and/or illustrated in this disclosure may be realized in whole or in part on computer-readable media. Computer readable media can include processor-executable instructions configured to implement one or more of the methods presented herein, and may include any mechanism for storing this data that can be thereafter read by a computer system. Examples of computer readable media include hard drives (e.g., accessible via network attached storage (NAS)), Storage Area Networks (SAN), volatile and non-volatile memory, such as read-only memory (ROM), random-access memory (RAM), EEPROM and/or flash memory, CD-ROMs, CD-Rs, CD-RWs, DVDs, cassettes, magnetic tape, magnetic disk storage, optical or non-optical data storage devices and/or any other medium which can be used to store data. Computer readable media may also comprise communication media, which typically embodies computer readable instructions or other data in a modulated data signal such as a carrier wave or other transport mechanism (e.g., that has one or more of its characteristics set or changed in such a manner as to encode information in the signal). The computer readable medium can also be distributed (e.g., using a switching fabric, such as used in computer farms) over a network-coupled computer system so that computer readable code is stored and executed in a distributed fashion.

Figure 15:
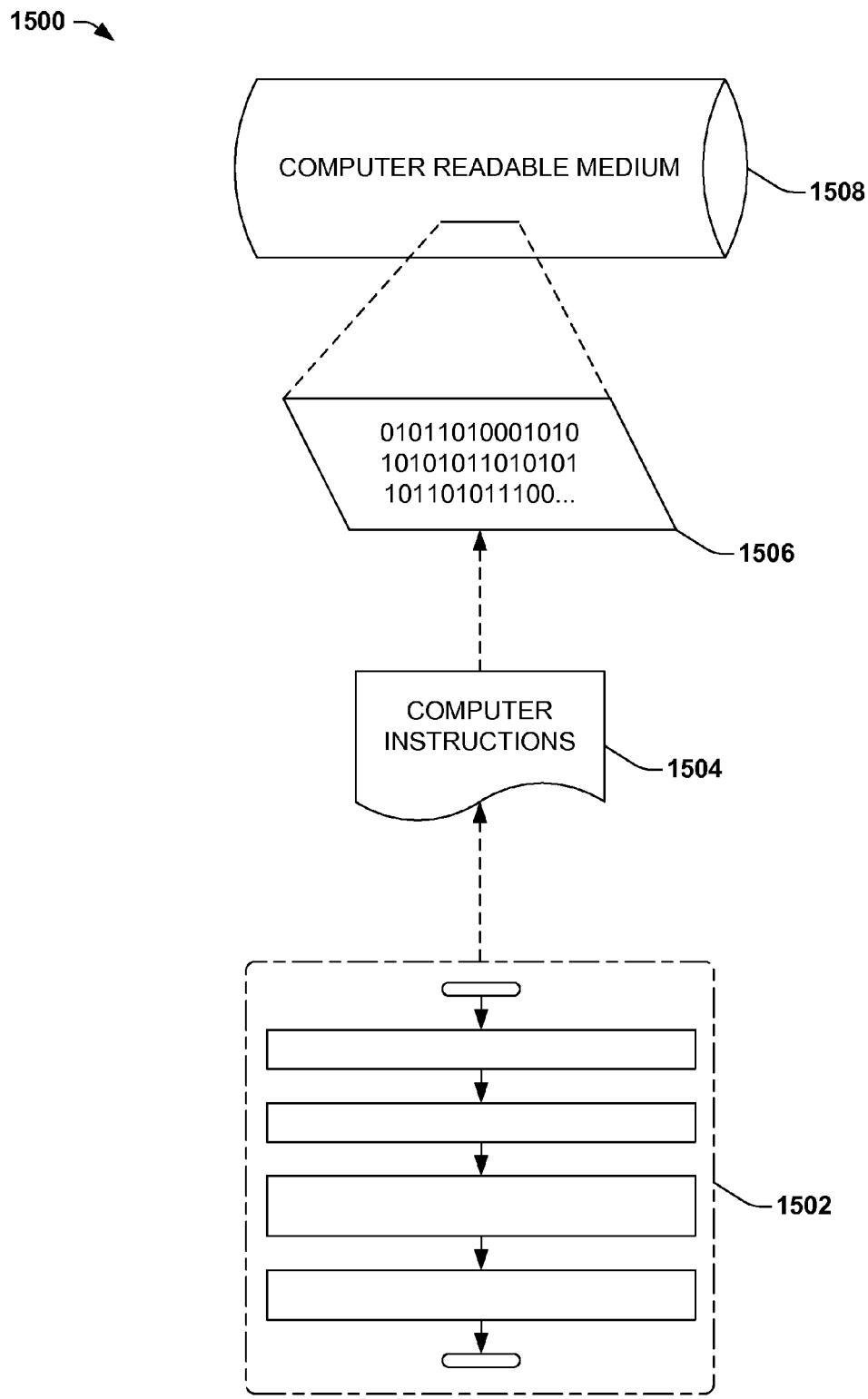
FIG. 15 is an illustration of a computer-readable medium comprising processor-executable instructions configured to embody one or more of the provisions set forth herein.

Another embodiment (which may include one or more of the variations described above) involves a computer-readable medium comprising processor-executable instructions configured to apply one or more of the techniques presented herein. An exemplary computer-readable medium that may be devised in these ways is illustrated in FIG. 15, where the implementation 1500 comprises a computer-readable medium 1508 (e.g., a CD-R, DVD-R, or a platter of a hard disk drive), on which is encoded computer-readable data 1506. This computer-readable data 1406 in turn comprises a set of computer instructions 1504 configured to operate according to the principles set forth herein. In one such embodiment, the processor-executable instructions 1504 may be configured to perform a methods, such as the method 300 of FIG. 3 or method 400 of FIG. 4, for example. Many such computer-readable media may be devised by those of ordinary skill in the art that are configured to operate in accordance with the techniques presented herein.

Moreover, unless specified to the contrary, the term "or" is intended to mean an inclusive "or" rather than an exclusive "or", and the articles "a" and "an" are generally to be construed to comprise "one or more". Furthermore, to the extent that the terms "includes", "having", "has", "with", or variants thereof are used, such terms are intended to be inclusive in a manner similar to the term "comprising".

What is claimed is:

1. A method for recovering lost data in a data storage system, comprising:
    identifying failure of a memory device of a first data storage device within a data storage system, the failure resulting in a data loss of a data block stored within the memory device;
    analyzing a logical address of a metadata unit associated with a physical address range in which the data block is stored to determine an arrangement of a first copied instance of the data block within the data storage system;
    selectively retrieving a first portion of the data block, according to the arrangement, by reading at least part of the first copied instance of the data block from a second data storage device within the data storage system;
    selectively recovering a second portion of the data block from parity information in the first data storage device; and
    recovering the data block based upon the first portion and the second portion to create a recovered data block comprising the first portion retrieved from the second data storage device and the second portion reconstructed from the parity information in the first data storage device.

2. The method of claim 1, the logical address referencing the data block within the first data storage device.

3. The method of claim 1, the logical address referencing the first copied instance of the data block within the second data storage device.

4. The method of claim 1, the metadata unit comprising a consistency point count corresponding to a checkpoint number at which an instance of the data block was written.

5. The method of claim 1, the metadata unit comprising a generation ID identifying a physical block associated with the data block.

6. The method of claim 1, the identifying comprising:
    responsive to determining that the metadata unit is lost based upon the failure of the memory device, recovering the metadata unit from a non-failed memory device.

7. The method of claim 1, the identifying comprising:
    responsive to determining that the metadata unit is lost based upon the failure of the memory device, recovering the metadata unit as a recovered metadata unit using at least one of a parity block or a second metadata unit.

8. The method of claim 7, comprising:
    receiving the recovered metadata unit from a memory device array controller.

9. The method of claim 1, the data storage system partitioned into a plurality of metadata zones and a plurality of data zones, a first metadata zone comprising the metadata unit and a first data zone comprising the data block.

10. The method of claim 1, comprising:
    verifying that a second signature identifier of the first copied instance of the data block corresponds to a first signature identifier for the data block, the first signature identifier specified within the metadata unit.

11. The method of claim 1, the parity information extracted from a parity data block within a parity memory device of the data storage system.

12. The method of claim 1, the parity information interleaved, as one or more parity blocks, with data blocks of the first data storage device.

13. A system for recovering lost data in a data storage system, comprising:
    one or more processors; and
    memory comprising instructions that when executed by at least one of the one or more processors implement at least some of:
        a data component configured to:
            identify failure of a memory device of a first data storage device within a data storage system, the failure resulting in a data loss of a data block stored within the memory device;
            analyze a logical address of a metadata unit associated with a physical address range in which the data block is stored to determine an arrangement of a first copied instance of the data block within the data storage system;
            selectively retrieve a first portion of the data block, according to the arrangement, by reading at least part of the first copied instance of the data block from a second data storage device within the data storage system;
            selectively recover a second portion of the data block from parity information in the first data storage device; and
            recover the data block based upon the first portion and the second portion to create a recovered data block comprising the first portion retrieved from the second data storage device and the second portion reconstructed from the parity information in the first data storage device.

14. The system of claim 13, the logical address referencing the data block within the first data storage device.

15. The system of claim 13, the logical address referencing the first copied instance of the data block within the second data storage device.

16. The system of claim 13, the metadata unit comprising a consistency point count corresponding to a checkpoint number at which an instance of the data block was written.

17. The system of claim 13, the metadata unit comprising a generation ID identifying a physical block associated with the data block.

18. The system of claim 13, the data component configured to:
    responsive to determining that the metadata unit is lost based upon the failure of the memory device, recover the metadata unit from a non-failed memory device.

19. The system of claim 13, the data component configured to:

responsive to determining that the metadata unit is lost based upon the failure of the memory device, recover the metadata unit as a recovered metadata unit using at least one of a parity block or a second metadata unit.

20. A non-transitory computer readable medium comprising instructions which when executed perform a method for recovering lost data in a data storage system, comprising:
  identifying failure of a memory device of a first data storage device within a data storage system, the failure resulting in a data loss of a data block stored within the memory device;
  analyzing a logical address of a metadata unit associated with a physical address range in which the data block is stored to determine an arrangement of a first copied instance of the data block within the data storage system;
  selectively retrieving a first portion of the data block, according to the arrangement, by reading at least part of the first copied instance of the data block from a second data storage device within the data storage system;
  selectively recovering a second portion of the data block from parity information in the first data storage device; and
  recovering the data block based upon the first portion and the second portion to create a recovered data block comprising the first portion retrieved from the second data storage device and the second portion reconstructed from the parity information in the first data storage device.

\* \* \* \* \*